United States Patent
Tury et al.

(10) Patent No.: US 6,373,255 B2
(45) Date of Patent: *Apr. 16, 2002

(54) DIAGNOSTIC TESTER FOR MULTI-BALLAST LIGHTING FIXTURE

(75) Inventors: Edward L. Tury, Brighton; Kenneth M. Spink, Jerome; Russel L. Belman, North Adams; Gary Van Deusen, Hillsdale, all of MI (US)

(73) Assignee: The Shane Group

( * ) Notice: Subject to any disclaimer, the term of this patent is extended or adjusted under 35 U.S.C. 154(b) by 0 days.

This patent is subject to a terminal disclaimer.

(21) Appl. No.: 09/742,461

(22) Filed: Dec. 20, 2000

Related U.S. Application Data

(63) Continuation of application No. 09/376,111, filed on Aug. 13, 1999, now abandoned, which is a continuation-in-part of application No. 08/633,079, filed on Apr. 16, 1996, now Pat. No. 6,087,834.

(51) Int. Cl.[7] .......................... G01R 31/00; G01R 31/14
(52) U.S. Cl. ........................ 324/414; 324/508; 324/511
(58) Field of Search ................................. 324/414, 508, 324/511, 72.5, 548, 403, 127, 133; 315/129

(56) References Cited

U.S. PATENT DOCUMENTS 3,934,195 A * 1/1976 Shires ....................... 324/72.5
4,155,036 A * 5/1979 Nicholson .................. 324/511
4,496,905 A * 1/1985 Forte et al. ................. 324/414
4,695,803 A * 9/1987 Rue ........................... 324/403

* cited by examiner

Primary Examiner—Safet Metjahic
Assistant Examiner—Wasseem H. Hamdan
(74) Attorney, Agent, or Firm—Young & Basile

(57) ABSTRACT

A diagnostic testing system for use with two or more lighting systems of the High Intensity Discharge (HID) sports lighting type, wherein two or more lighting systems have their ballasts and diagnostic receptacles combined in a single ballast box at the base of a light pole for diagnostic access. Each lighting system has its own diagnostic receptacle electrically coupled to the other lighting system through a common block supplying power to the multi-system fixture. Each lighting system typically comprises at least one lamp, a ballast, a capacitor, and wiring interconnecting the lamp, ballast, and capacitor. Each diagnostic receptacle includes a continuity plug wired to maintain electrical connection to the common block while it is plugged in, and to cause its associated lighting system to be electrically isolated from the common block when the plug is removed. The diagnostic receptacles are adapted to receive a connector from a hand-held diagnostic tester which maintains the electrical isolation from the common block during the diagnostic testing.

2 Claims, 14 Drawing Sheets

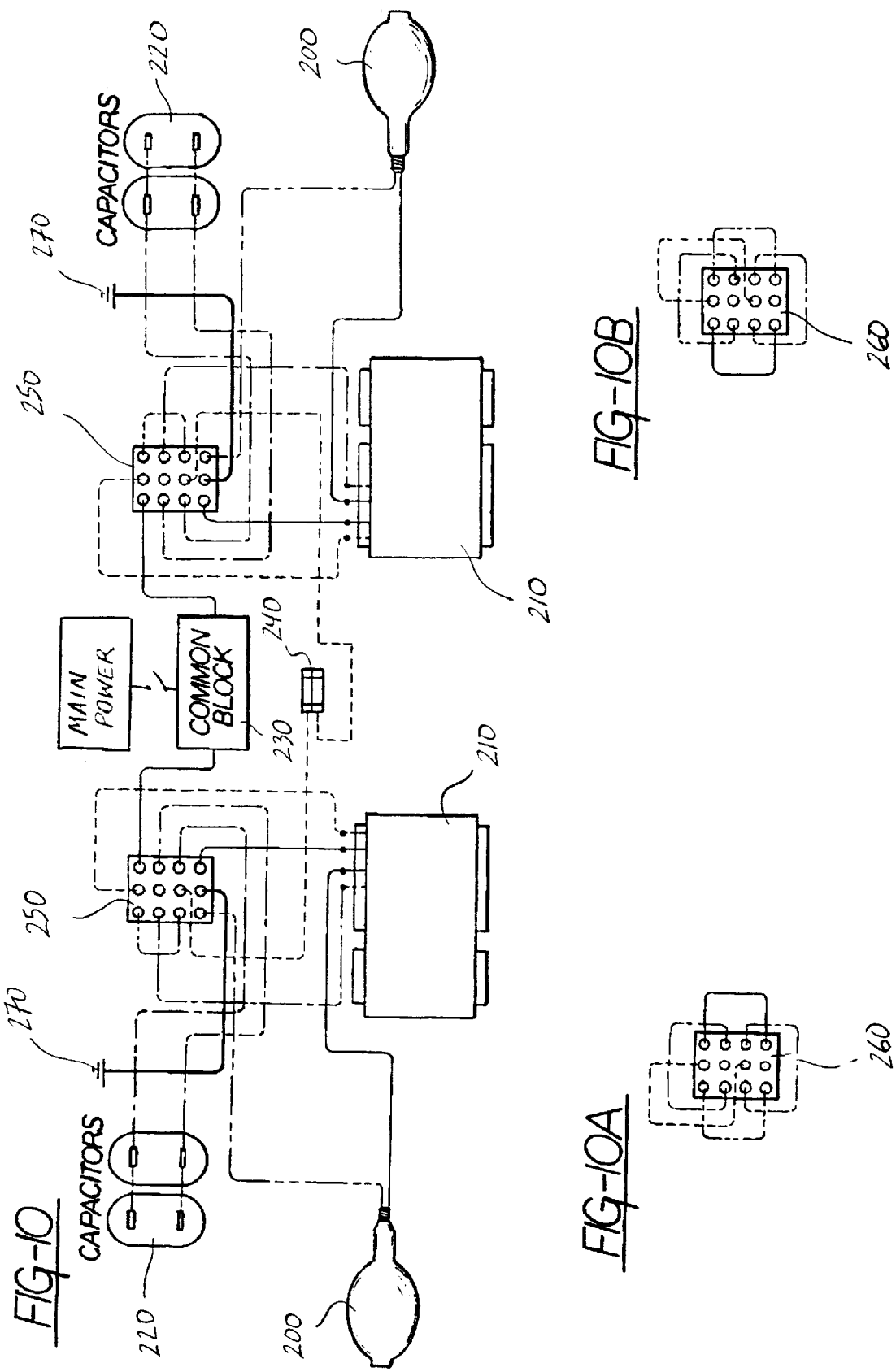

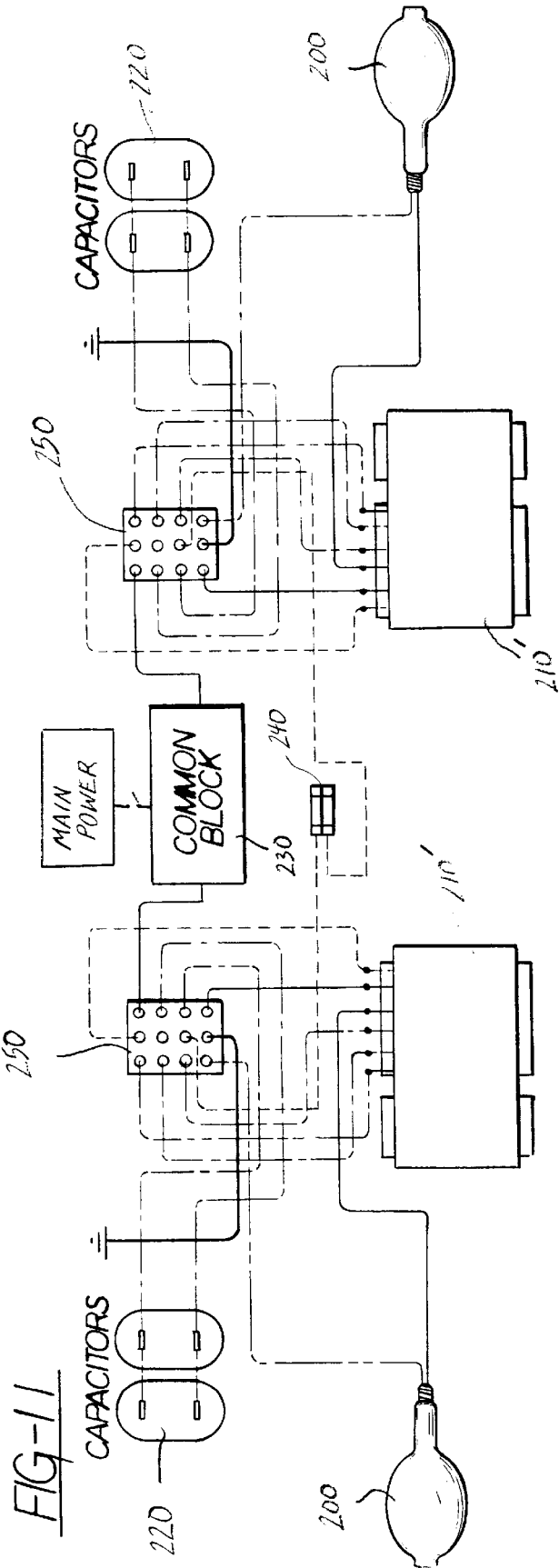

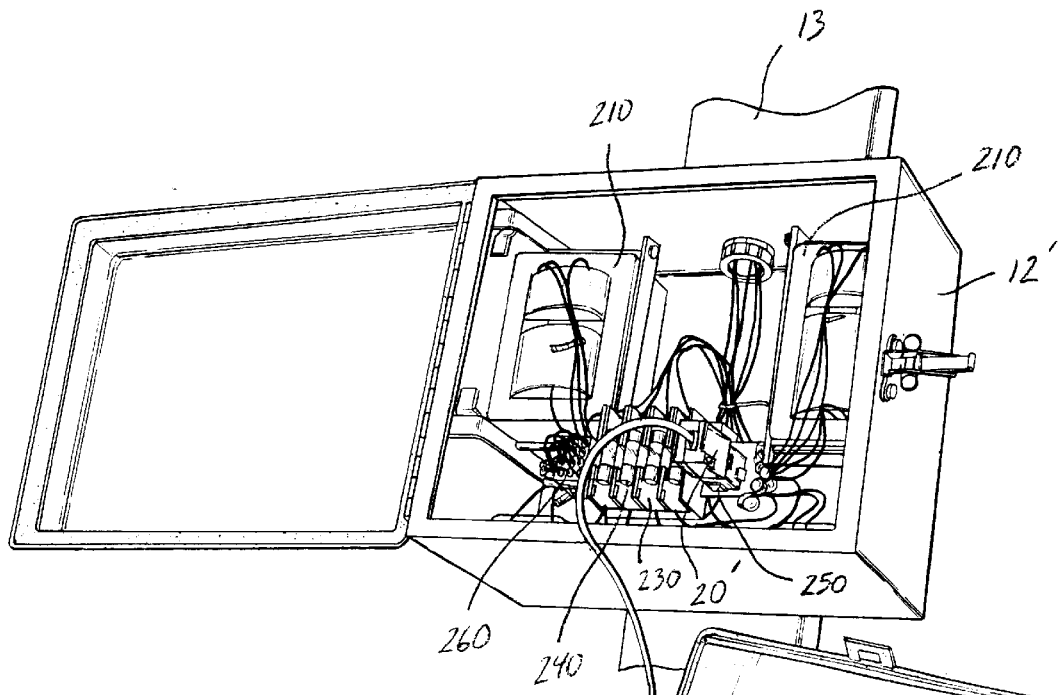
FIG-12
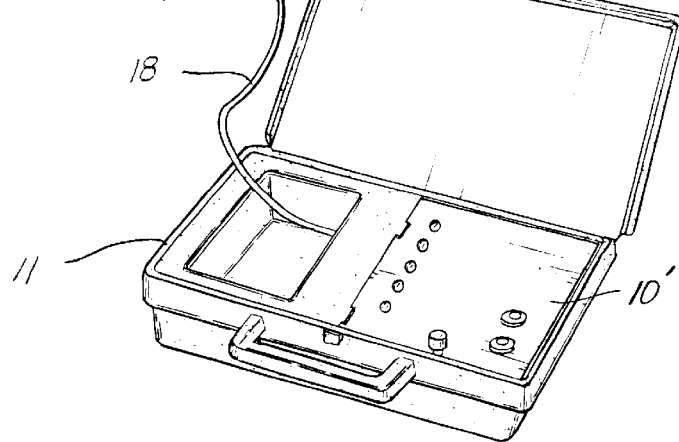
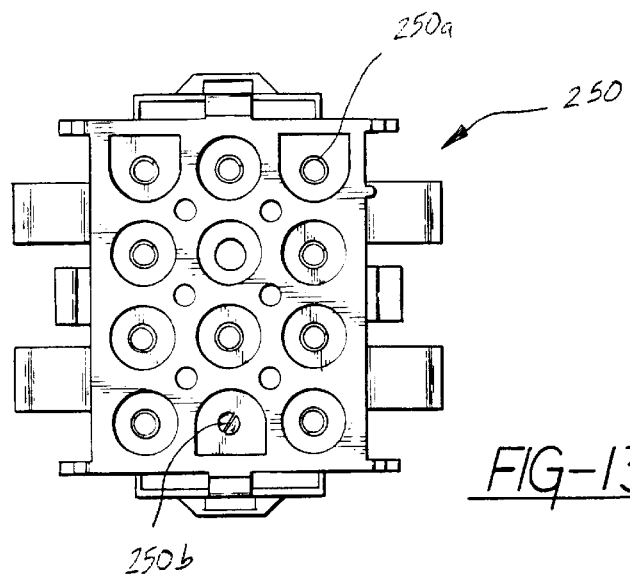
FIG-13

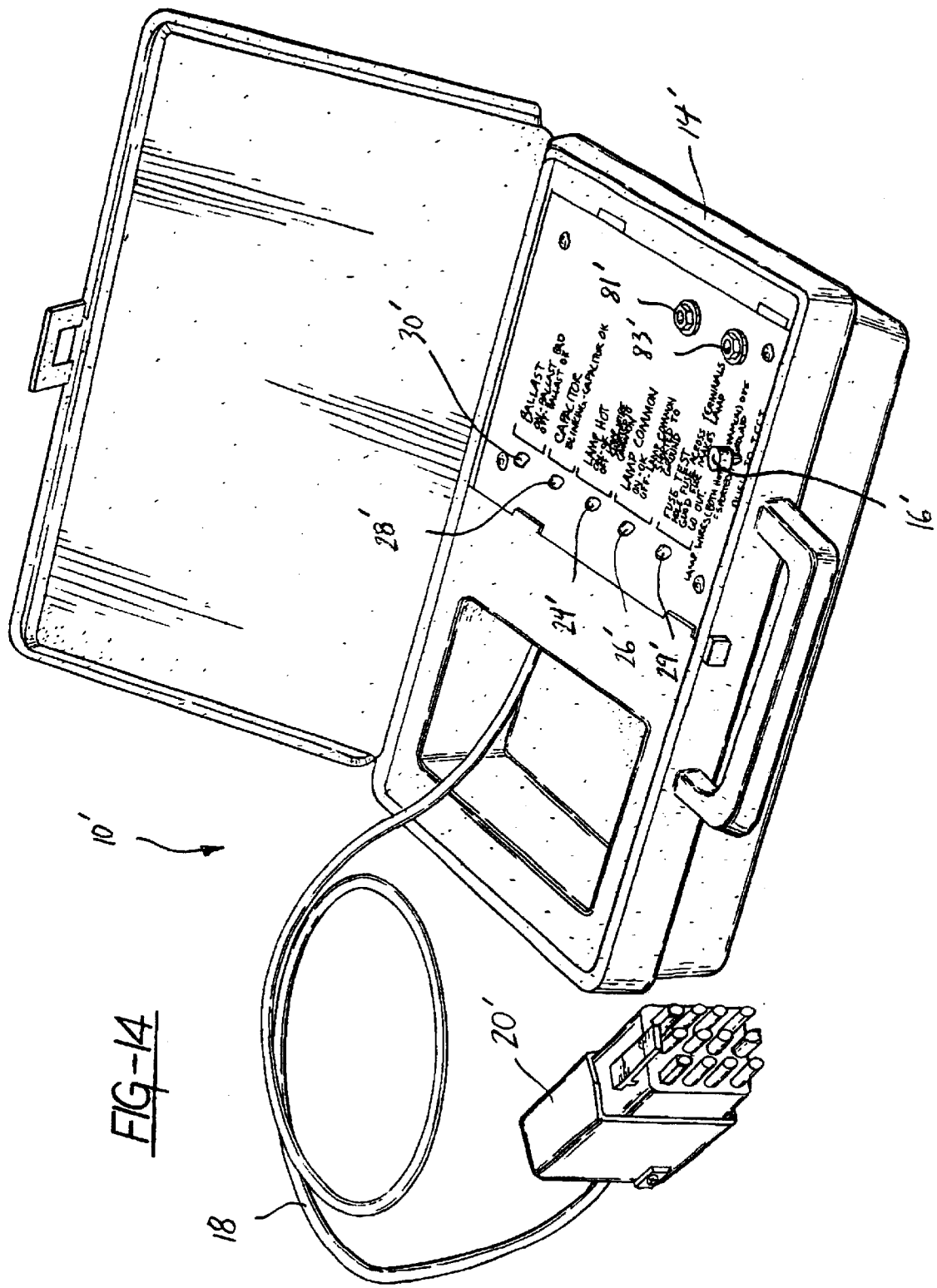

| CIRCUIT BOARD PIN # | DIAGNOSTIC CONNECTOR PIN # |
|---|---|
| 1 | 2 |
| 2 | 6 |
| 3 | 9 |
| 4 | 1 |
| 5 | -- |
| 6 | 4 |
| 7 | 7 |
| 8 | 10 |
| 9 | 12 |
| 10 | 11 |

FIG - 14B

DIAGNOSTIC TESTER FOR MULTI-BALLAST LIGHTING FIXTURE

Related Applications

This application is a continuation of U.S. Ser. No. 09/376,111 Aug. 13, 1999 now abandoned, which in turn is a continuation-in-part of U.S. application Ser. No. 08/633,079 filed Apr. 16, 1996 (now issued as U.S. Pat. No. 6,087,834 issued Jul. 11, 2000).

FIELD OF THE INVENTION

The present invention relates to an apparatus and method for testing the electrical components and wiring contained in a lighting system.

BACKGROUND OF THE INVENTION

Lighting systems used to illuminate athletic fields such as baseball fields, football fields, soccer fields and the like generally require the installation of light fixtures 20–120 feet above the ground. The light fixtures are often installed in arrays mounted at the top of a support pole. If any light fixture in a lighting array malfunctions, it may be difficult to determine the source of the failure without the use of a crane or ladder capable of reaching the light fixtures.

Lighting systems which use high intensity discharge (HID) lamps require the use of ballasts, capacitors, and various wires interconnecting the components of the lighting system. The failure of a lamp, ballast, capacitor, or wire may result in the failure of the lighting system.

Current test methods involve disconnecting each component to test them individually or swapping each component in and out of the lighting system to locate any defective components. This procedure requires electrical power to be applied to the system, and/or the use of special meters and the technical specifications for each component in order to determine the operability of each component. Furthermore, these tests may isolate problems in a particular component, but cannot detect problems in the wiring between the components without the use of a crane or boom truck to reach the light fixtures at the top of the pole.

Therefore, these previous attempts to locate faults in lighting systems are expensive, time-consuming, and must be performed by an electrician due to the requirement of a live power test. Additionally, the testing of HID lighting systems requires a specialized knowledge not held by all electricians. Thus, previous diagnostic testing systems and methods required a qualified electrician possessing the appropriate knowledge and special meters to test HID lighting systems.

SUMMARY OF THE INVENTION

The present diagnostic tester provides an apparatus for testing a lighting system having at least one lamp, a capacitor, a ballast, and various wires interconnecting these lighting system components. The diagnostic tester is capable of isolating the particular component or wiring in the lighting system producing the failure of the lamp, including failure of the lamp itself. The diagnostic tester connects to a diagnostic receptacle on a light pole easily accessible from the ground, rather than by a crane. The tests are performed with the lighting system power turned off and therefore may be performed by maintenance personnel, rather than an electrician. Since the power is off, the risk of injury due to electric shock is eliminated.

The components of the lighting system are not disconnected to perform the test, thereby making the testing easier, faster, and less expensive. Since the testing is performed at or near ground level, the use of a crane or similar apparatus is not required. Therefore, maintenance costs are reduced by permitting the quick identification of problem components. Additionally, the diagnostic tester permits the pretesting of light fixtures on the ground before installation on the lighting poles.

The diagnostic tester includes a connector adapted to operatively engage the diagnostic receptacle. Means are provided in the diagnostic tester for automatically and simultaneously testing the ballast, the capacitor, and the plurality of wires contained in the lighting system which connect the capacitor and the ballast to a single lamp.

A multivibrator circuit connected to any illuminatible device is used to test the capacitor and the illuminatible device blinks if the capacitor is functioning properly. A ballast test circuit includes an illuminatible device, such as a light emitting diode, and a driver for indicating whether the primary and the secondary of the ballast is functioning properly. A wiring test circuit includes at least a pair of light emitting diodes, and possibly an optional LED, along which associated drivers for indicating whether the plurality of wires in the lighting system connected between the ballast and the lamp are properly connected.

A continuity plug is capable of being inserted into the diagnostic receptacle when the diagnostic tester is disconnected from the diagnostic receptacle. The continuity plug, when inserted into the diagnostic receptacle, interconnects the lamp wiring, the ballast and the capacitor in a normal operable manner for normal operation of the lighting system.

When testing the lighting system, power is first disconnected from the lighting system. The LED's in the tester are then tested for proper operation. Next, the continuity plug is removed from the diagnostic receptacle and the diagnostic tester is connected to the receptacle. The capacitor is tested and its associated light emitting diode indicates whether the capacitor is functioning properly. Similar tests are performed on the ballast and wiring contained in the lighting system.

One of the LEDs in the tester may also be employed for indicating the continuity of a lighting system fuse. In this optional embodiment, a pair of terminals are mounted on the tester housing and are engageable with opposite ends of a lighting system fuse. The terminals are connected across the indicator such that the application of electrical power to the indicator and the terminals will enable the indicator to indicate the continuity or non-continuity of a fuse connected across the terminals by the on or off state of the indicator.

In another embodiment in which a lighting system employs a higher wattage lamp which requires the use of a separate ignitor, the diagnostic tester of the present invention may also be employed to test the ignitor by employing the same lighting wiring test procedures described herein.

After all tests have been performed, the diagnostic tester is disconnected from the diagnostic receptacle and the continuity plug is reinserted into the diagnostic receptacle. Finally, power is restored to the lighting system.

It is becoming increasingly common to mount two or more lighting systems on a single pole with the lighting systems (lamp, capacitor, ballast, and various wires interconnecting them) sharing a single ballast box. Power is often supplied to these dual-system, single ballast box fixtures via a "common block" power and fusing terminal. In a further form of the invention, a dual-system ballast box having a "common block" is provided with two diagnostic receptacles. Each diagnostic receptacle is electrically interconnected with the common block and one lighting system's lamp, capacitor, ballast, and wiring through a special continuity plug. The manner in which each diagnostic receptacle is wired into its respective lighting system and the common block through the continuity plug provides an automatic isolation of the system from the common block when the continuity plug is removed for testing. This isolation prevents the possibility of backfeed from the other ballast sharing the common block. Backfeed from the untested ballast can result in a false reading with respect to a particular component or wiring in the system being tested.

This dual-system, single-box diagnostic receptacle arrangement is tested with a diagnostic tester and connector modified from the single-system receptacle described above. The continuity plug for each dual system receptacle also differs from the single-system plug, and provides automatic isolation of an associated lighting system from the common block.

The dual-system receptacles are also useful for high wattage systems which may include extra capacitor and lamp wire connections in the ballast.

BRIEF DESCRIPTION OF THE DRAWINGS

The various features, advantages and other uses of the present invention will become more apparent by referring to the following description and drawings in which:

FIG. 10 is a schematic representation of a dual-system ballast and diagnostic receptacle arrangement, wherein two lighting systems, each with its own ballast, capacitor, lamp and wiring, are provided with diagnostic receptacles contained in a single ballast box having a common block for power supply and fusing;

FIG. 10A is a schematic representation of the wiring of a continuity plug for the lefthand ballast and diagnostic receptacle in FIG. 10;

FIG. 10B is a schematic representation of the wiring of a continuity plug for the righthand ballast and diagnostic receptacle of FIG. 10;

FIG. 11 is a schematic representation of a dual-system ballast and diagnostic receptacle arrangement, similar to that of FIG. 10 but arranged to test a higher wattage fixture in which the ballast is provided with an additional capacitor and lamp connection;

FIG. 11A is a schematic representation of the wiring of a continuity plug for the lefthand diagnostic receptacle of FIG. 11;

FIG. 11B is a schematic representation of the continuity plug wiring for the righthand diagnostic receptacle of FIG. 11;

FIG. 12 is a perspective view of a dual-system ballast box containing two diagnostic receptacles according to the present invention, and a diagnostic tester according to the present invention plugged into one of the diagnostic receptacles in the ballast box;

FIG. 13 is a plan view of the pin terminals of the multi-pin diagnostic receptacle of FIG. 12, useful for the embodiments of FIGS. 10 and 11;

FIG. 14 is a close up view of the display panel of the diagnostic tester of FIG. 12;

FIG. 14B is a table showing the connections between the circuit board pins of the diagnostic tester of FIG. 14A and the connector of the tester;

DETAILED DESCRIPTION OF THE PREFERRED EMBODIMENT

Figure 1:
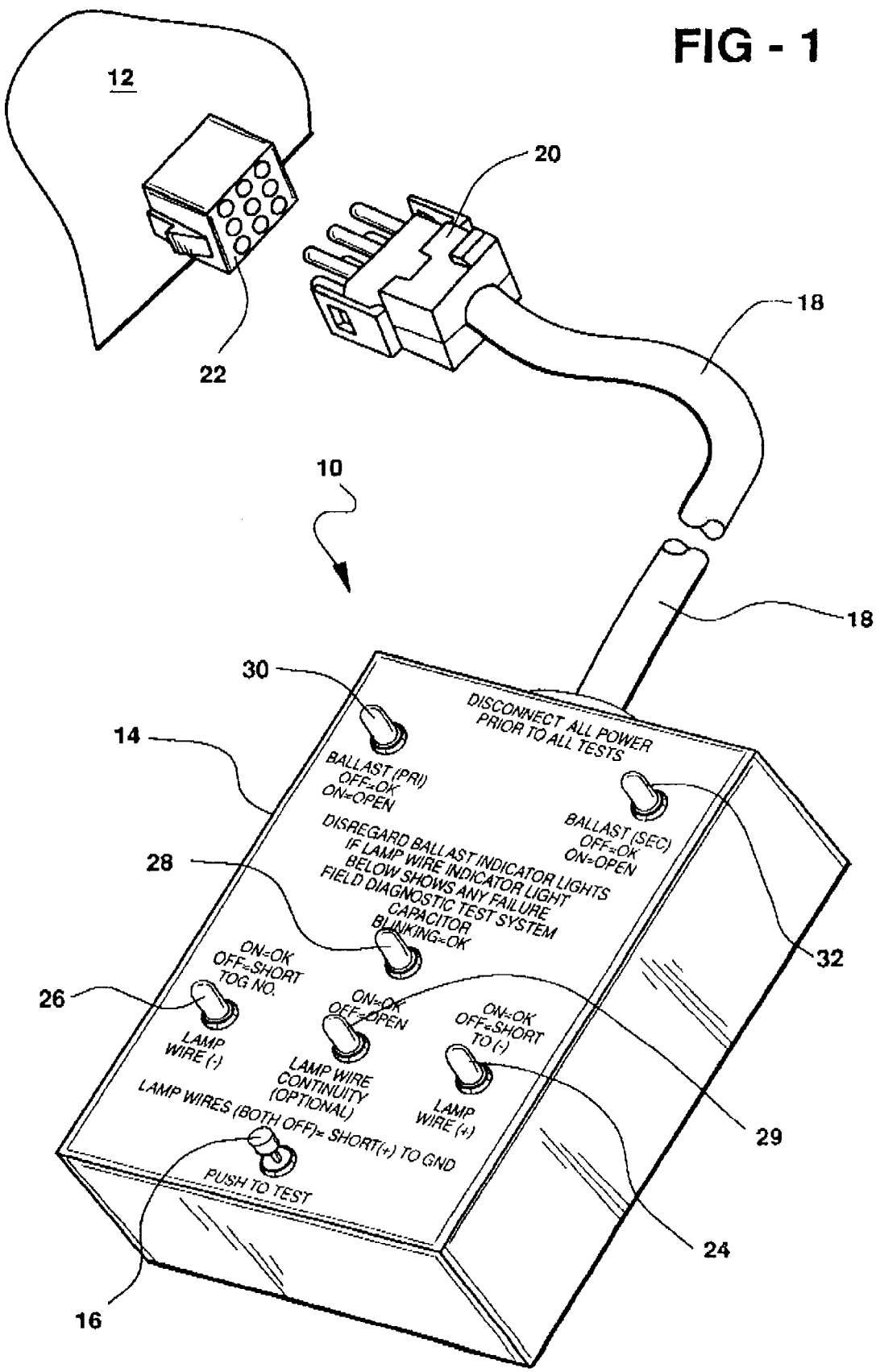
FIG. 1 is a perspective view of a diagnostic tester and diagnostic receptacle accoriding to the present invention.

Referring to FIG. 1, a diagnostic tester 10 according to the present invention is illustrated. Diagnostic tester 10 includes a housing 14 which contains the circuitry and components of the tester 10. A push button switch 16 is used to activate the diagnostic tester 10 as described hereinafter.

A cable 18 extends from diagnostic tester 10 and has a male connector 20 at its terminal end. A ballast box 12, which forms part of the lighting system to be tested and is typically mounted a short distance; i.e., 10 feet, above grade on a light pole, includes a female multi-pin diagnostic receptacle 22. Receptacle 22 is mounted within ballast box 12 and is electrically connected to the various components of the lighting system. Preferably, male connector 20 is a plug-in, quick-release connector which is designed to mate with diagnostic receptacle 22. However, any other type of connector may be employed in the present diagnostic tester 10.

Diagnostic receptacle 22 may be installed in ballast box 12 at the time of manufacture, or may be retrofitted into an existing ballast box already installed in a lighting system. To retrofit receptacle 22 to an existing ballast box, the receptacle 22 is connected as described below with reference to FIG. 2. A complete lighting installation may include several ballast boxes, with each ballast box having a diagnostic receptacle for each ballast therein.

Diagnostic tester 10 is a small hand-held device capable of being carried easily from one test location to another. Tester 10 has an internal power source and performs the tests automatically, thereby requiring only minimal interaction by the operator.

Separate illuminatible devices, such as light emitting diodes, (LED's 24, 26, 28, 30, and 32) are used to indicate whether various components of the lighting system are functioning properly LED 29 is optional, as described hereafter. The function of each LED will be described below with reference to the schematic diagram illustrated in FIG. 4. Although the present invention is described as utilizing light emitting diodes, it will be understood by those skilled in the art that various other types of indicator and illuminatible devices may be used to indicate proper component operation. Such other devices include various types of lights, meters, of display panels.

Figure 2:
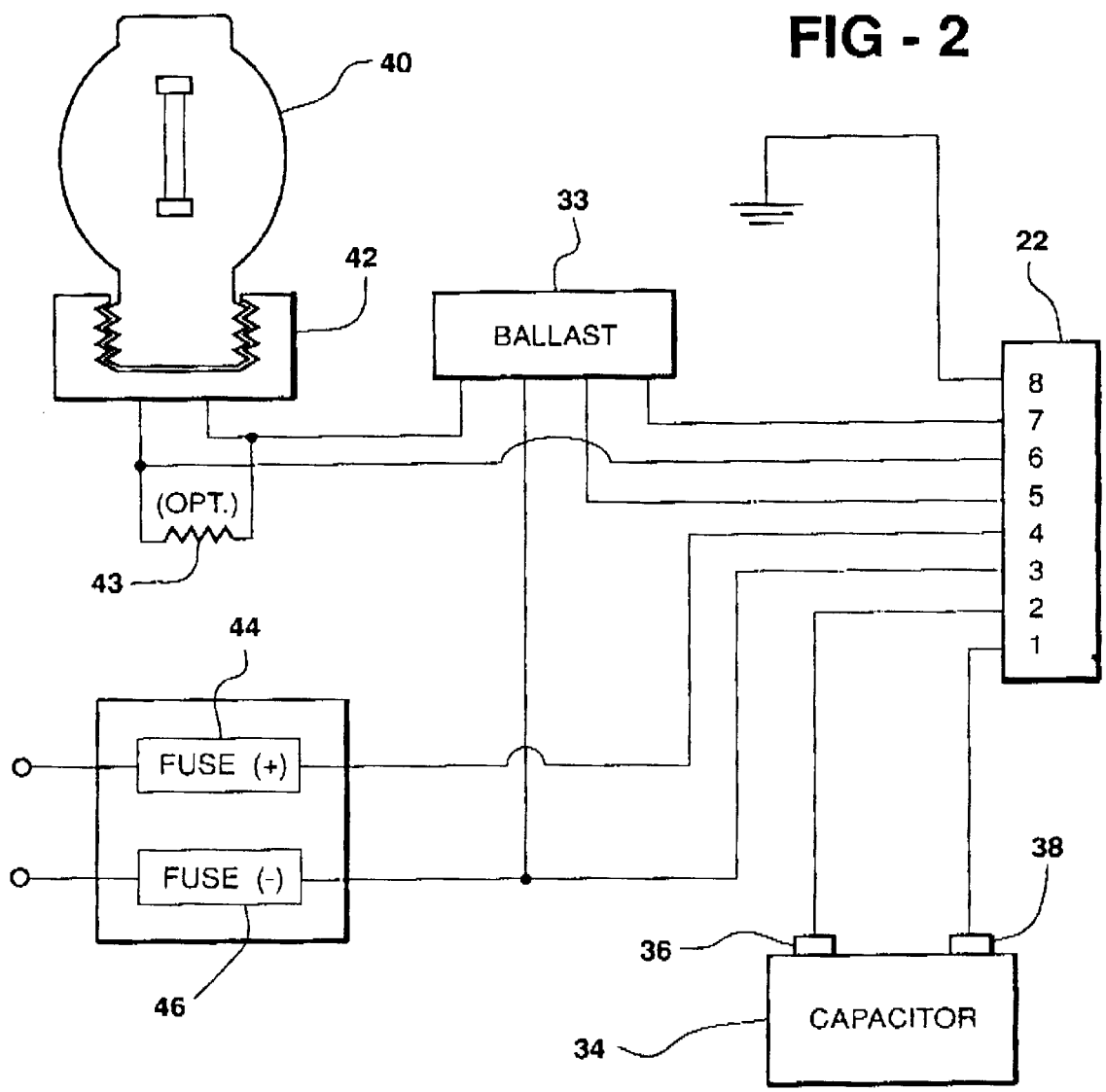
FIG. 2 is a block diagram illustrating the interconnection of the diagnostic receptacle with various components of a lighting system.

FIG. 2 illustrates a block diagram of the various components in the lighting system and their electrical interconnection with each other and with diagnostic receptacle 22. Receptacle 22 is shown having a plurality of electrical connection points representing a plurality of electrical pins in the receptacle 22. A ballast 33 is connected to pin 7 of diagnostic receptacle 22. Additionally, ballast 33 is connected to a lamp 40, and a negative line fuse 46. A capacitor 34 has a first terminal 36 and a second terminal 38. First capacitor terminal 36 is connected to pin 2 of diagnostic receptacle 22, and second capacitor terminal 38 is connected to pin 1 of the diagnostic receptacle. An HID lamp 40 is mounted in lamp socket 42 which is connected to ballast 33 and pin 6 of diagnostic receptacle 22. An optional resistor 43 is connected across the leads of the socket 42. A positive line fuse 44 is connected to pin 4 of diagnostic receptacle 22. Negative line fuse 46 is connected to ballast 33 as well as pin 3 of diagnostic receptacle 22.

Figure 3:
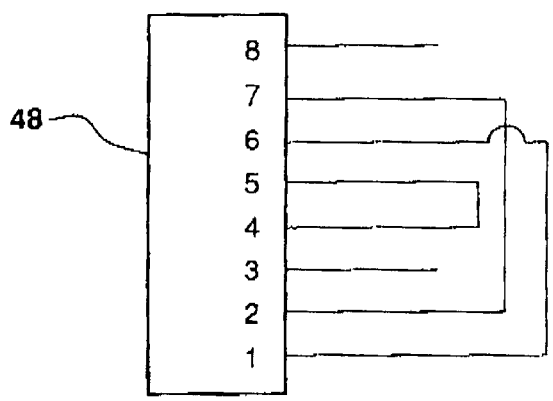
FIG. 3 is a schematic diagram showing a continuity plug as used with the present invention and its electrical connections.

When the diagnostic tester 10 is not attached to diagnostic receptacle 22, a continuity plug 48 is mated with the diagnostic receptacle 22. FIG. 3 illustrates the electrical connections contained within continuity plug 48. The pin numbers illustrated in FIG. 3 correspond with and electrically connect with the pin numbers illustrated in FIG. 2 with respect to diagnostic receptacle 22. In particular, pins 4 and 5 are shorted together, thereby directing power from positive line fuse 44 directly to ballast 33. Additionally, pins 7 and 2 are shorted together, thus connecting the first capacitor terminal 36 to ballast 33. Finally, pins 1 and 6 are shorted together, thereby connecting second capacitor terminal 38 to lamp socket 42. Therefore, when continuity plug 48 is mated with diagnostic receptacle 22, the lighting system operates in a normal manner.

Figure 4:
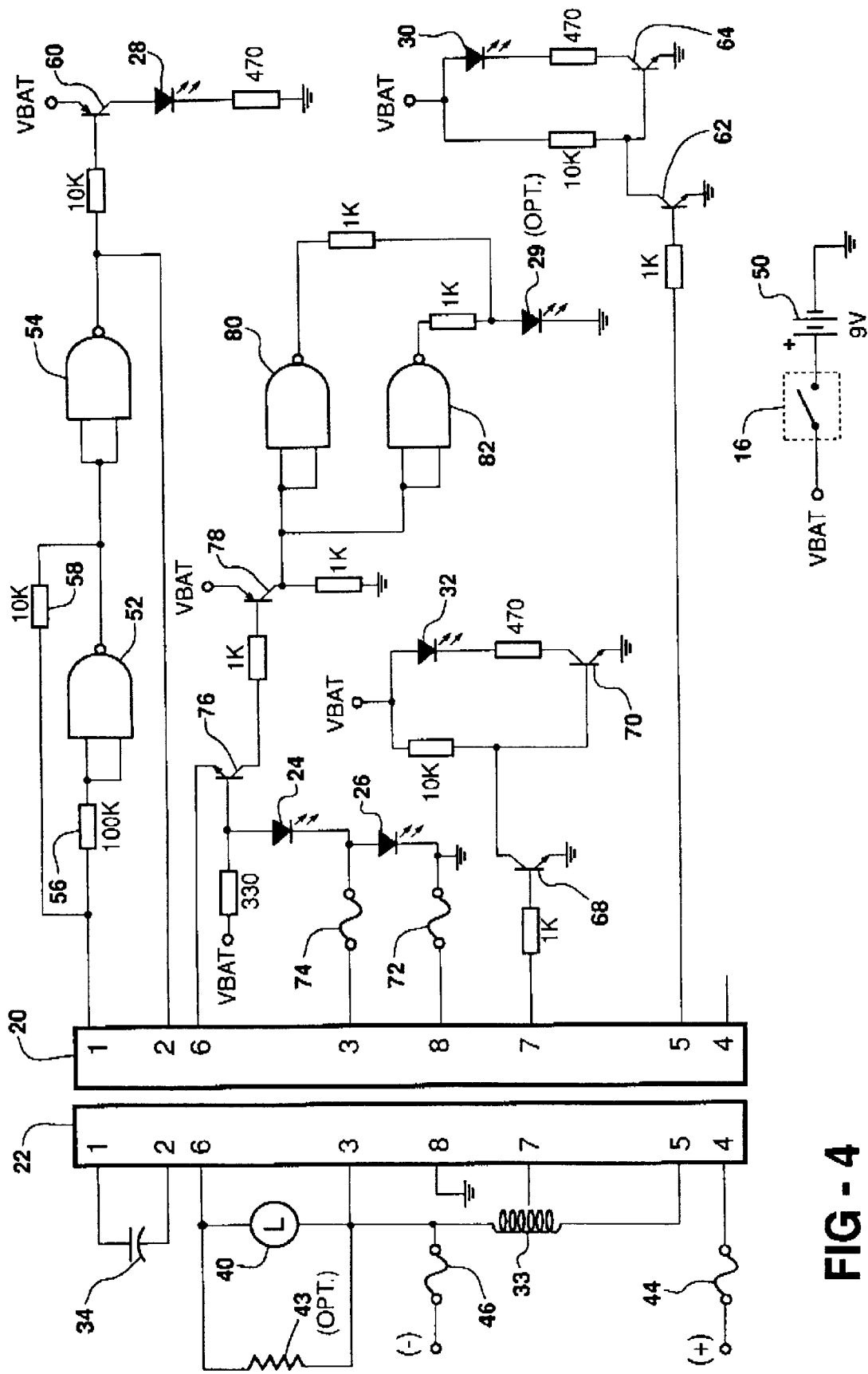
FIG. 4 is a schematic diagram of the inventive diagnostic tester and the lighting system components being tested.

FIG. 4 illustrates a schematic diagram of the diagnostic tester 10 circuit as well as the lighting system components being tested. The left side of the schematic illustrated in FIG. 4 represents the components of the lighting system, and resembles the connections illustrated in FIG. 2. Capacitor 34 is connected between pins 1 and 2 of diagnostic receptacle 22. Pin 4 of diagnostic receptacle 22 is connected to positive line fuse 44, and pin 8 of the diagnostic receptacle is connected to ground. Pins 3, 5, and 7 are connected to ballast 33, while pins 6 and 3 are connected to lamp 40.

Male connector 20 on diagnostic tester 10 is a multi-pin connector which mates with diagnostic receptacle 22. Preferably, connector 20 is a quick-release connector for simple connection with receptacle 22.

A 9-volt battery 50 is connected between ground and switch 16, thereby providing power (indicated by signal VBAT) to the tester circuit when the switch 16 is depressed. The various illuminatible devices or LED's 24, 26, 28, 29, 30 and 32 are biased by their respective drive transistors to a conductive state when VBAT power is applied thereto and the connector 20 is disconnected from the connector 22 on the receptacle 12. This provides a check of the operability of each LED.

Pins 1 and 2 of connector 20 connect with capacitor terminals 36 and 38. The circuit formed by NAND gates 52 and 54 as well as resistors 56, 58 creates a multi-vibrator circuit with capacitor 34. When capacitor 34 is connected and functioning properly, the multi-vibrator circuit oscillates, thereby causing transistor 60 to turn on and off and causing LED 28 to blink.

If LED 28 does not blink, then the capacitor 34 is either defective or improperly connected. The rate at which LED 28 blinks is a function of the capacitance of capacitor 34. The greater the capacitance of capacitor 34, the slower LED 28 blinks. If LED 28 blinks extremely fast, capacitor 34 may be defective; i.e., the capacitor 34 may have a reduced capacitance.

The ballast continuity is tested using pins 5 and 7 of connector 20. The circuit connected to pin 5 of connector 20 tests the ballast primary. If the ballast primary is functioning properly, a base current is conducted to transistor 62, connecting the remainder of the circuit to ground. Therefore, the base of transistor 64 is connected to ground, thereby extinguishing LED 30. Therefore, if LED 30 is illuminated, the ballast primary is malfunctioning, i.e., an open circuit.

Pin 7 of connector 20 is connected through a resistor to the base of transistor 68, which receives a base current from the ballast secondary. If a base current is present, transistor 68 connects the remainder of the circuit to ground, thereby extinguishing LED 32. An illuminated LED 32 indicates a malfunctioning ballast secondary.

The lamp 40 wiring extends from the ballast 33 and the receptacle 22 up along a light pole, not shown, to a junction connection with leads to the socket 42 in the light fixture.

If the lamp wiring is not connected properly, i.e., open at the socket 42, transistor 76 will conduct through optional resistor 43, thereby causing transistor 78 to conduct. The activation of transistor 78 causes signal VBAT to be applied to the inputs of NAND gates 80 and 82. Since the inputs of NAND gates 80 and 82 are wired together as inverters, a logic HI signal is applied to the NAND gate inputs thereby generating a logic LO signal at the output and extinguishing optional LED 29. Therefore, if LED 29 is off, a lamp socket wiring continuity fault is indicated. Conversely, if LED 29 is illuminated, proper lamp socket wiring is present.

In the preferred form, an HC4011 integrated circuit is used to provide the four NAND gates 52, 54, 80, and 82. The two inputs of each NAND gate are electrically connected together, thereby causing each NAND gate to operate as an inverter.

As shown in FIG. 4, the positive power lead is connected through transistor 76 and LED's 24 and 26 to ground. A fuse 74 is connected to pin 3 of the connector 20 and to the junction of LED's 24 and 26. LED 26 is connected through fuse 72 to ground in the receptacle 22. Thus, LED 24 will be illuminated if the positive lamp wiring is properly connected; but when not illuminated, a short to the negative lead is present. Similarly, LED 26 will be illuminated if the negative lamp wiring is properly connected. When LED 26 is not illuminated a short of the negative wiring to ground is indicated. If both LED's 24 and 26 are not illuminated at the same time during a test, a short of the positive wiring to ground is present.

Figure 5:
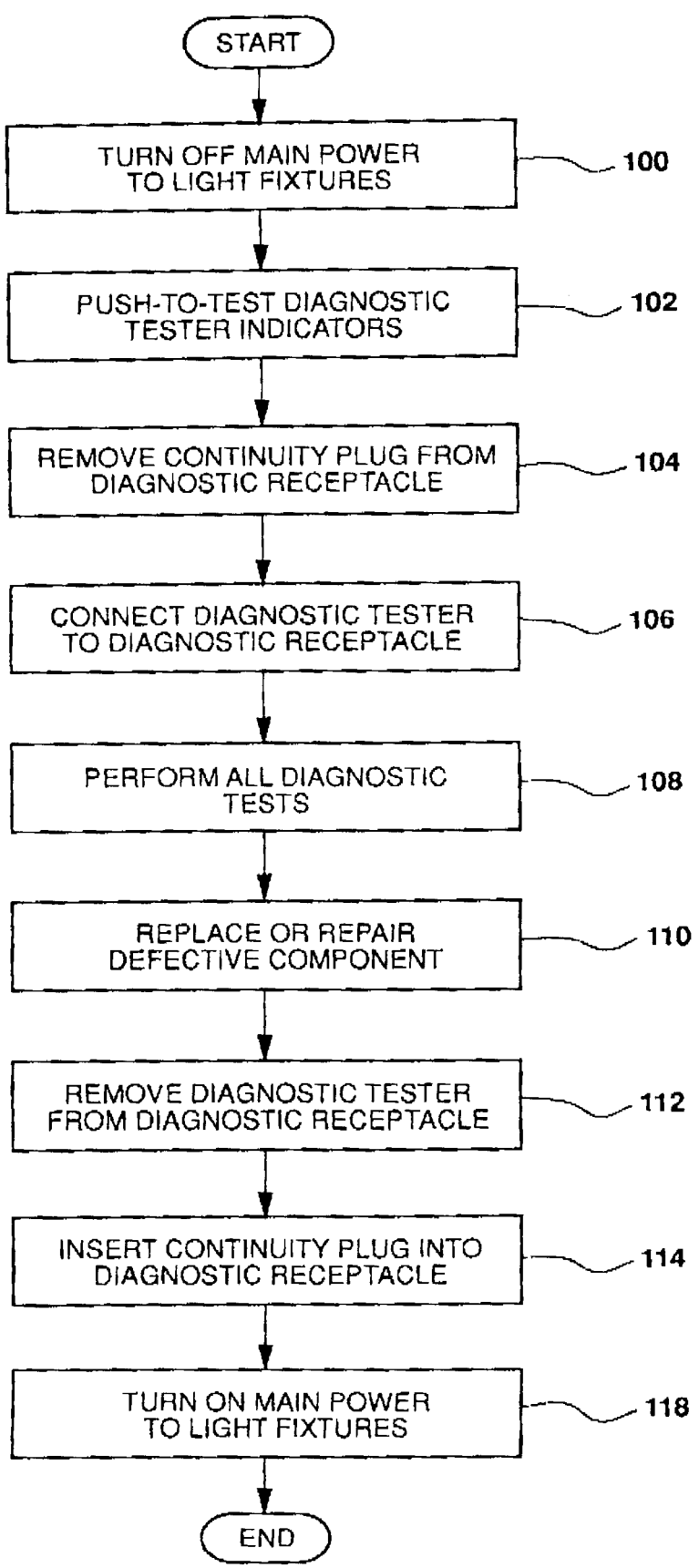
FIG. 5 is a flow chart describing the overall procedure used when testing a lighting system according to the present invention.

In operation, the lighting system is tested with the main power off, as shown in FIG. 5 at step 100. At step 102, before the tester 10 is connected to the receptacle 22, switch 16 is depressed to test the operability of all of the LED's in the tester 10 by applying power to each LED to cause illumination of each operable LED. Next, continuity plug 48 is removed from diagnostic receptacle 22 at step 104. Next, at step 106, the diagnostic tester 10 is connected to diagnostic receptacle 22, causing all diagnostic tests to be performed automatically at step 108.

Depending on the lighting system components which do not pass the diagnostic tests, one or more LED's on the diagnostic tester will indicate a faulty component or faulty wiring by an "on" or "off" state as described above and as shown in FIG. 1 on the face of the tester 10. If the diagnostic tester 10 indicates that all tests have passed, but one or more lamps in the lighting system are not functioning properly, this indicates that the lamp is at fault.

Thus, the tester 10 determines a lamp fault by process of elimination; i.e., if all other components and wiring are functioning properly, then the lamp must be the defective component.

At step 110, the defective component or components are replaced or repaired. At step 112, the diagnostic tester 10 is removed from diagnostic receptacle 22, and continuity plug 48 is reinserted into the diagnostic receptacle at step 114. Finally, at step 118, main power to the light fixtures in the lighting system is turned on.

Figure 6:
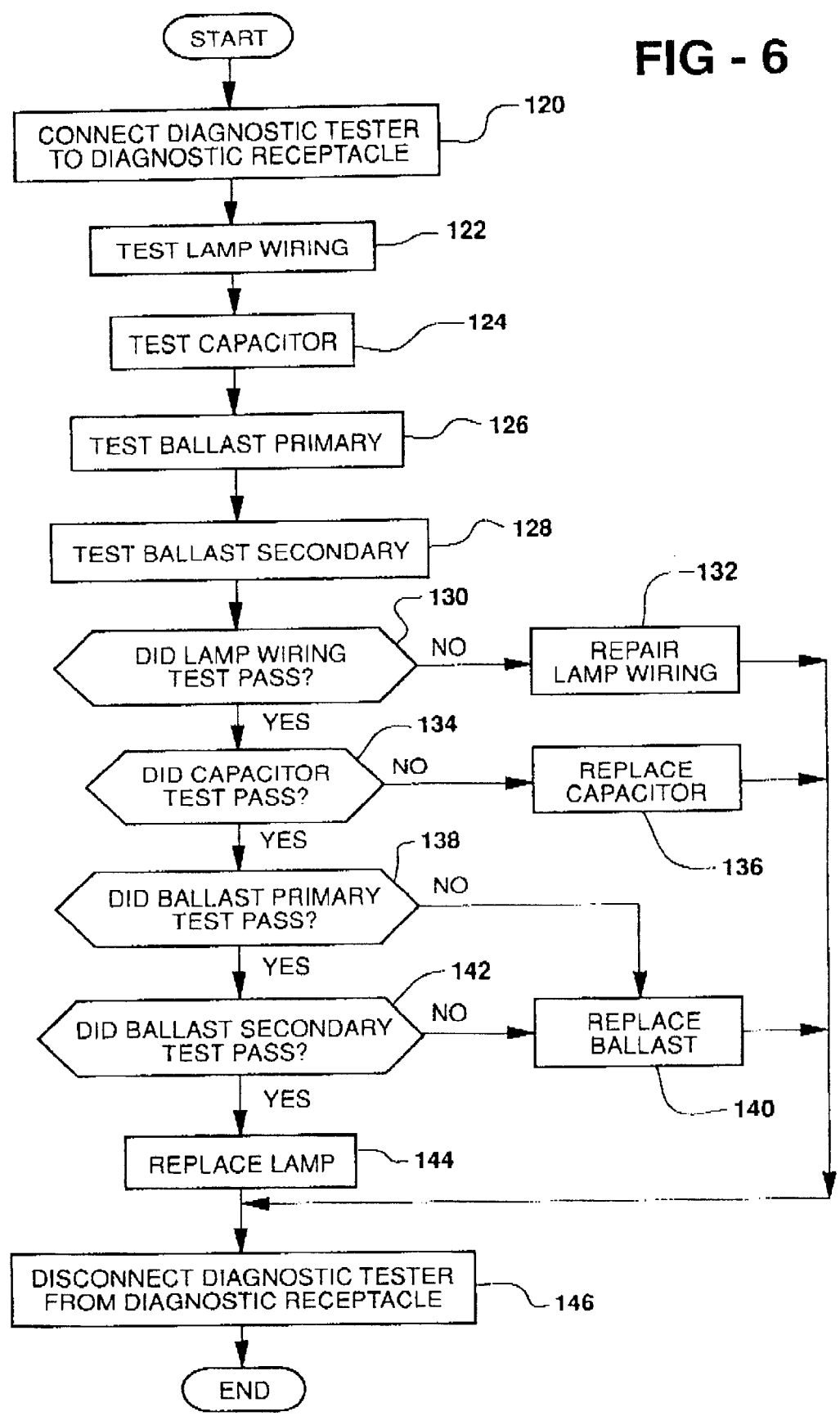
FIG. 6 is a flow chart describing the procedure followed to determine which component or components of the lighting system are malfunctioning.

FIG. 6 is a flow chart which illustrates the procedure followed to determine which component or components of the lighting system are malfunctioning. In FIG. 6, step 120 corresponds to step 106 in FIG. 5.

Similarly, step 146 corresponds to step 112 in FIG. 5. Steps 122-144 are an expanded depiction of steps 108 and 110 in FIG. 5. At step 120, which corresponds to step 106 in FIG. 5, the diagnostic tester 10 is connected to the diagnostic receptacle 22. Step 122 tests the lamp wiring, step 124 tests the capacitor, step 126 tests the ballast primary, and step 128 tests the ballast secondary. Although steps 122–128 are illustrated as four separate steps, these tests are performed simultaneously by the diagnostic tester 10. As shown in FIG. 4, separate test circuits are provided to test each component of the system, thereby permitting simultaneous testing of the lighting components. The results of all diagnostic tests are indicated by the LED's on the diagnostic tester 10.

At step 130 the operator determines whether the lamp wiring test passed by observing LED's 24, 26 and/or optional LED 29. If LED 24 is illuminated or "on" the positive wire is properly connected. However, an off or not illuminated state for LED 24 indicates that the lamp positive wire is shorted to the negative wire. LED 26 provides a similar indication of the operability of the negative lamp wire, but with an off state indicating a short to ground. An "off" or non-illuminated state of both LED's 24 and 26 indicates that both that the positive wire is shorted to ground. If LED 29 is illuminated or on, then the lamp socket leads have continuity. If LED 29 is not illuminated, then there is a fault in the lamp leads at the lamp socket. If any part of the lamp wiring test did not pass, then the lamp wiring is repaired at step 132, and the testing procedure is completed at step 146 by removing the diagnostic tester 10 from the diagnostic receptacle 22. If the lamp wiring test passed at step 130, then the operator next determines whether the capacitor test passed at step 134.

If the capacitor 34 is functioning properly, LED 28 blinks on and off. If LED 28 does not blink, or blinks extremely fast, then the capacitor 34 is faulty. If the capacitor test did not pass, then the capacitor 34 is replaced at step 136, and the testing is completed at step 146.

If the capacitor test passed at step 134, then the operator next determines whether the ballast primary test passed at step 138. LED 30 is off if the ballast primary is functioning properly. If LED 30 is illuminated, then the ballast primary is open. If the ballast primary test failed, the ballast 33 is replaced at step 140.

If the ballast primary test passed, then the user next determines whether the ballast secondary test passed at step 142. If LED 32 is off, then the ballast secondary is functioning properly. An illuminated LED 32 indicates that a fault exists in the ballast secondary. If the ballast secondary test failed, then the ballast 33 is replaced at step 140, and the lighting tests are completed.

If the ballast secondary test passed, and the lighting system is still inoperative, then the lamp 40 is replaced at step 144, and the testing is completed at step 146. Thus, the lamp 40 is tested by process of elimination. As shown in FIG. 6, the wiring, capacitor, ballast primary, and ballast secondary are tested first to determine proper operation. If any one or more of these components fail their respective test, then that particular component is repaired or replaced. If a lighting system is not functioning properly, but all four of the above-mentioned tests passed, the lamp 40 is determined to be at fault and is replaced. Therefore, if the lighting system is not working and all components except the lamp 40 are functioning properly, the lamp 40 must be the malfunctioning component in the lighting system.

Once the diagnostic tester 16 is connected to the diagnostic receptacle, the diagnostic tester 10 performs all tests automatically and simultaneously. The diagnostic tester 10 does not require any user input or user intervention, other than determining the status of the various LED's in the diagnostic tester 10 during testing.

It should also be noted that even though the present diagnostic tester 10 has been described as simultaneously testing each of the ballast 33, the capacitor 34 and the lamp wiring, the diagnostic tester 10 can also be constructed to test any one or two of these components.

Figure 7:
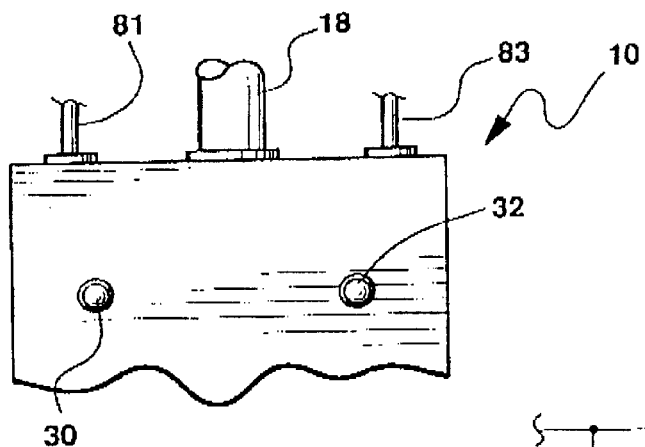
FIG. 7 is a pictorial representation of a modification to the diagnostic tester of the present invention according to an alternate embodiment of the present invention.
Figure 8:
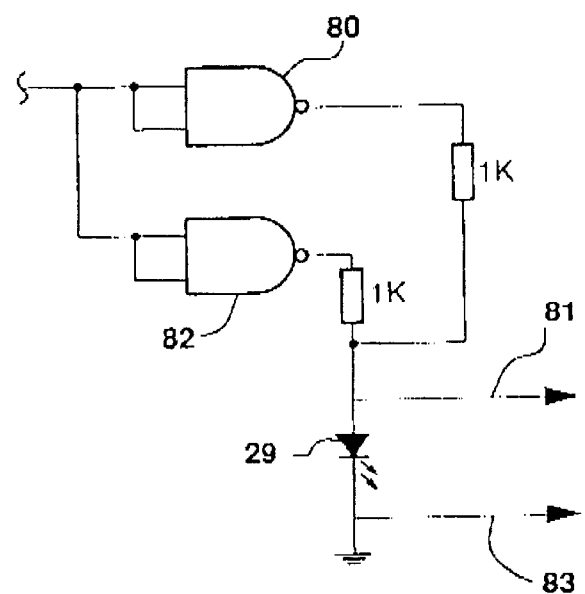
FIG. 8 is a partial schematic representation showing a modification to the schematic of FIG. 4 for use in conjunction with the modification depicted in FIG. 7.

The diagnostic tester 10 of the present invention may also be modified to perform additional tests. As shown in FIGS. 7 and 8, the diagnostic tester 10 may be used to test the continuity of the fuses 44 and 46 used in the lighting system circuit. As is conventional, such fuses 44 and 46 are typically of the "midget" type and have two opposed conductive end caps or contacts. As shown in FIG. 7, a pair of terminals 81 and 83 are mounted on the housing of the diagnostic tester 10 at any convenient location. Thus, although the pair of terminals 81 and 83 are shown as being mounted on the top of the housing, it will be understood that the pair of terminals 81 and 83 may also be mounted on the bottom or any other surface of the housing. The terminals 81 and 83 are connected across the optional indicator or LED 29 as shown in FIG. 8.

In use, the terminals 81 and 83 are engaged with opposite conductive ends of a fuse 44 or 46. The "push-to-test" push button 16 is then depressed to supply power to the transistors 76 and 78, shown in FIG. 4, and to the NAND gates 80 and 82 shown in FIGS. 4 and 8. If the fuse connected across the terminals 81 and 83 has continuity, the LED 29 will be in a non-illuminated state. However, if the fuse is defective or open, the LED 29 will be illuminated thereby providing indication of a defective fuse. It should be noted that the fuse test is conducted while the connector 18 is disconnected from the ballast box 12.

Figure 9:
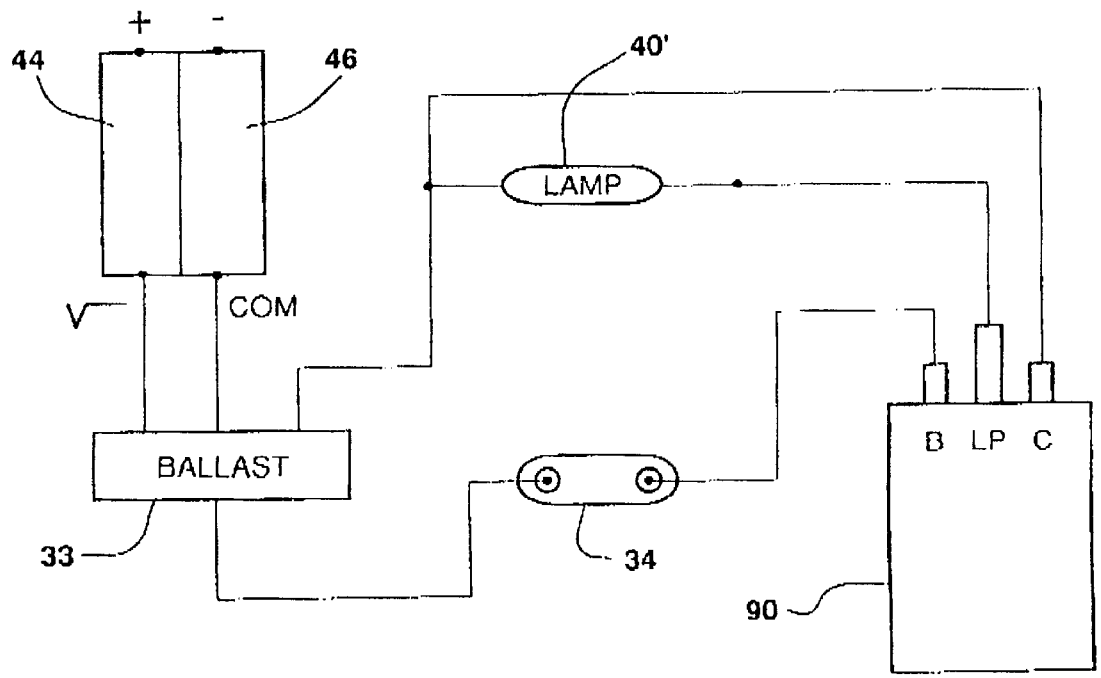
FIG. 9 is a schematic diagram of an alternate light system circuit which can be tested by the diagnostic tester of the present invention.

The diagnostic tester 10 may also be used to detect the operability of an ignitor 90 shown in FIG. 9 which is used with a higher wattage lamp 40', such as a 2000 watt lamp. Such a higher wattage lamp will require a capacitor 34 and a higher wattage ballast 33 which are interconnected with fuses 44 and 46 as shown in FIG. 9. It will also be understood that a second series connected ballast 33 and capacitor 34 may be connected in parallel with the ballast 33 and capacitor 34 shown in FIG. 9.

As the leads of the lamp 40' are connected to the lamp post and common terminals of the ignitor 90, the diagnostic tester 10 can also test the operability of the ignitor 90 in the same manner as the test described above for testing proper wiring of the lamp leads. The lamp socket connections are connected to the connector pins 3 and 6 as shown in FIG. 4 and can provide an indication of the operability or non-operability of the ignitor 90 by performing the same lamp wiring test described above. Thus, if the ignitor has failed, typically by shorting to ground, the lamp connection will be open causing transistors 76 and 78 to conduct as shown in FIG. 4 and described above. Conduction of transistor 78 through the NAND gates 80 and 82 causes the optional LED 29 to remain off when a continuity fault is present or to remain illuminated when proper ignitor 90 operation is detected.

Referring now to FIGS. 10–16, an embodiment of the invention is disclosed for diagnostic testing of multiple lighting systems installed on a single pole, and in particular for situations where two or more ballasts are contained in a single ballast box and share a "common block" for power supply and fusing in a manner which is known to those skilled in the art.

Referring first to FIG. 10, a first embodiment of a multiple-system diagnostic receptacle arrangement according to the invention is illustrated for a lower-wattage, "single ended" lamp fixture in which two lighting systems, each with its own lamp, ballast, capacitor and wiring, share a power supply through a common block and have their ballasts and diagnostic receptacles contained in a single ballast box on a light pole. FIGS. 10, 10A and 10B schematically represent the wiring for the two lighting systems, their respective diagnostic receptacles, and their continuity plugs.

Each lighting system in FIG. 10 is similar to that shown in FIG. 2, comprising an HID lamp 200, a ballast 210, one or more capacitors 220, a power supply 230, fuse 240 connected to the "hot" power wire, a multi-pin diagnostic receptacle 250, and a mating continuity plug 260. Each system is grounded at 270.

Unlike the lighting system in FIG. 2, the two lighting systems in FIG. 10 share both a ballast box and their power supply through a common block at 230. Use of the common block simplifies the main power disconnect and fusing for the lighting systems.

In the illustrated embodiment of FIG. 10, diagnostic receptacles 250 and their continuity plugs 260 are twelve-pin receptacles and plugs. This requires modification to the diagnostic tester 10 and its nine-pin connector 20 of FIG. 1 to accommodate the additional terminals and wiring, in particular the common block isolation feature described below.

It will also be understood by those skilled in the art that the number of pins in diagnostic receptacle 250 and plug 260 can vary depending on the wiring and components for a given lighting system.

The pin-receiving terminals in receptacle 250 can be assigned "numbers", as can the mating pins in the continuity plug. It will be apparent from FIGS. 10, 10A and 10B that lefthand and righthand receptacles 250 and lefthand and righthand continuity plugs 260 are mirror images of one another for purposes of the drawing, but in an actual ballast box installation they will have the same left-right, up/down order and orientation of terminals and pins so that the diagnostic tester connector may be plugged into each in identical fashion.

The following description of the function and structure of one diagnostic receptacle 250 and associated continuity plug 260 applies equally to the other lighting system sharing common block 230 in the ballast box.

Figure 15:
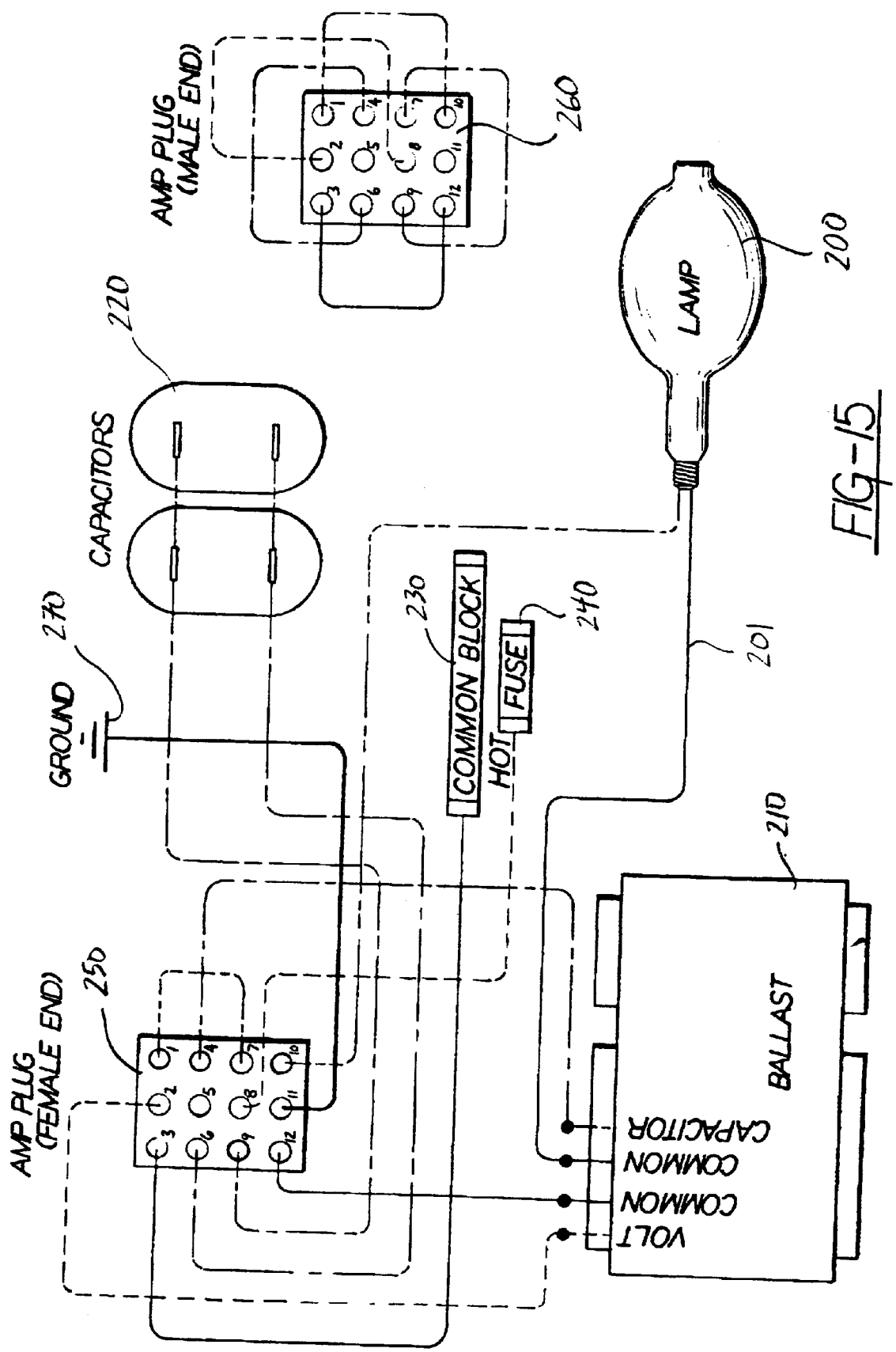
FIG. 15 is an enlarged view of the righthand lighting system of FIG. 10.
Figure 16:
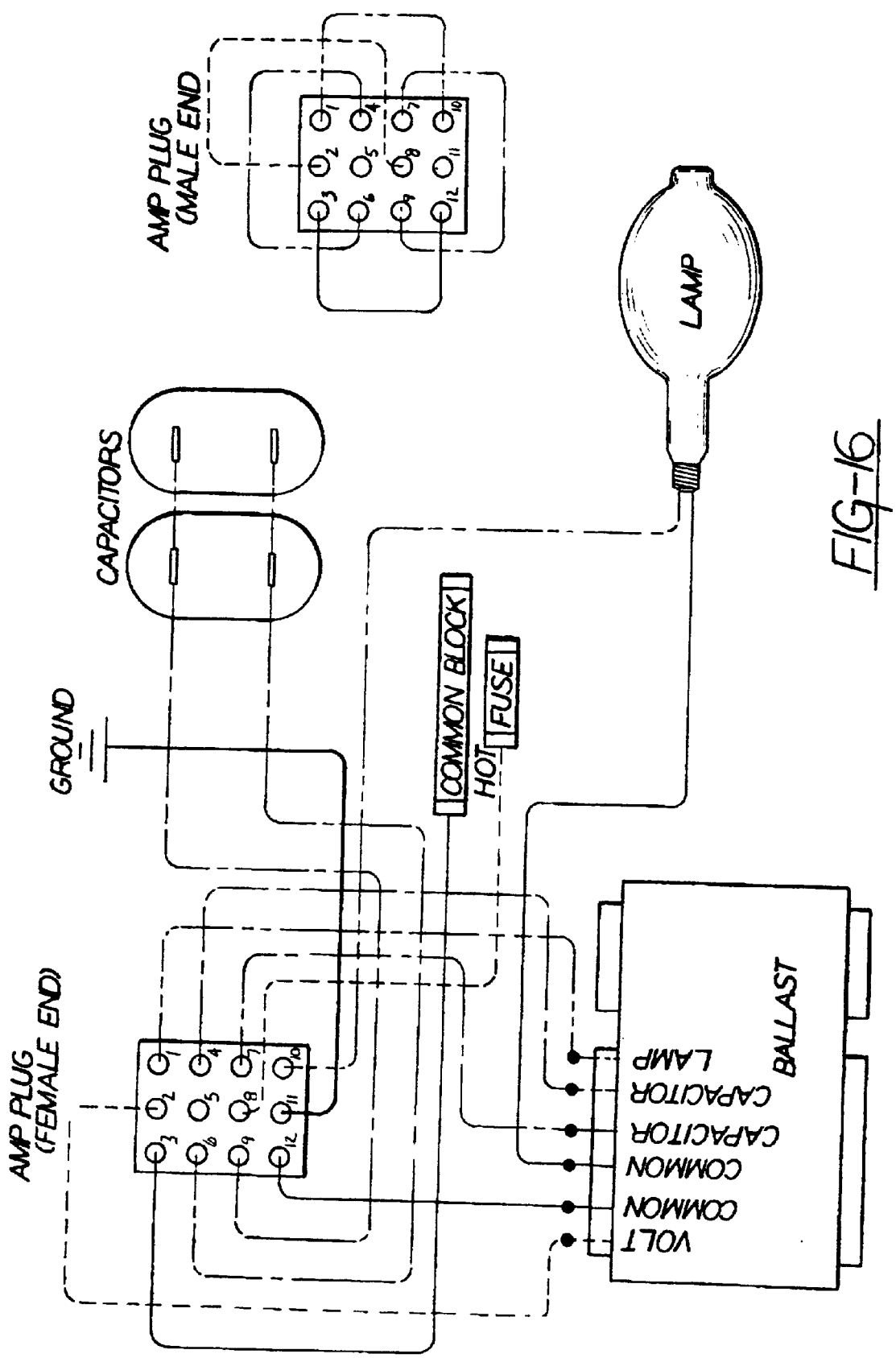
FIG. 16 is an enlarged view of the righthand lighting system of FIG. 11.

Referring to FIGS. 10 and 15, the wire connections between the various components of the lighting system (ballast, capacitors, lamp, fuse, common block) and the diagnostic receptacle 250 are schematically illustrated. Terminals 1 and 7 of the diagnostic receptacle are crimped together, reserved for use with higher wattage lamps as will be described below. Terminal 2 is connected to the voltage output of the ballast. Terminal 3 is connected to the common block 230. Terminal 4 is connected to the ballast capacitor terminal. Terminal 5 is open. Terminal 6 is connected to one terminal of the capacitor 220. Terminal 8 is connected to the fuse 240. Terminal 9 is connected to the other terminal of capacitor 220. Terminal 10 is connected to the lamp socket. Terminal 11 is connected to ground. Terminal 12 is connected to a common terminal at the ballast. Also, lamp 200 is connected to a common terminal at the ballast via line 201.

As illustrated, each continuity plug is provided with "jumper" wires or other electrical connections between respective pairs of pins in the multi-pin array. As best shown in FIG. 15, there is a jumper between pins 8 and 2; between pins 6 and 4; between pins 9 and 7; between pins 10 and 1 and; between pins 12 and 3. These jumpers in the illustrated embodiment comprise short loops of wire crimped or otherwise electrically secured to two of the pins. Pins 11 and 5 are open for purposes described below.

It will be understood from the foregoing that continuity plug 260 connects the various components and wiring of the lighting system when the continuity plug is inserted in diagnostic receptacle 250. For example, the jumper between pins 4 and 6 in continuity plug 260 electrically interconnects terminals 4 and 6 of diagnostic receptacle 250, thereby connecting one terminal of capacitor 220 to the ballast.

The above-illustrated and described wiring and jumper arrangement for the diagnostic receptacles 250 and their continuity plugs 260 provides an automatic isolation of each ballast 210 and its associated lighting system components from the common block 230 upon removal of continuity plug 260 from receptacle 250, by breaking the electrical connection between terminals 3 and 12. Combined with the wiring of the diagnostic tester connector 20' and the circuitry of the diagnostic tester 10' (best shown in FIGS. 14A and 14B), the ballast and associated lighting system being tested is isolated from common block 230 and the other lighting system in the ballast box. This feature is important because it prevents feedback or false readings from the ballast/lighting system not being tested.

In operation, each lighting system sharing common block 230 in FIG. 10 is tested in the same manner as depicted above with reference to FIGS. 1–9, in particular FIG. 5. The main power is first turned off to common block 230, such that both lighting systems sharing common block 230 are without power. Before the tester is connected to the receptacle, the tester itself is tested for operability of all of the LED's. Next, one of the continuity plugs 260 is removed from its receptacle 250, automatically isolating that receptacle and lighting system from common block 230. The diagnostic tester 10 is then connected to the open diagnostic receptacle 250, causing all of the diagnostic tests of which the tester is capable to be performed automatically as described above. Isolation of the lighting system being tested from common block 230 and the untested lighting system sharing the common block is maintained throughout the diagnostic testing.

Depending on the lighting system components which do not pass the diagnostic tests, one or more LED's on the diagnostic tester will indicate a faulty component or faulty wiring by an "on" or "off" or blinking/flashing state as described above. If components or wiring are found to be defective, they are replaced or repaired. It will be understood that the procedure followed to determine which components of the lighting system being tested are malfunctioning is the same as that described in FIG. 6 above. The diagnostic tester is then removed from receptacle 250, and continuity plug 260 is reinserted into the diagnostic receptacle.

At this point the testing procedure differs from that described above with reference to FIGS. 1–9. Rather than turning on main power to the fixture, the other continuity plug 260 is removed from the other diagnostic receptacle 250 associated with the common block, and the previously untested lighting system associated therewith is tested in identical fashion.

After the second continuity plug 260 is returned to its diagnostic receptacle 250, main power to the lighting systems is turned back on.

Referring now to FIGS. 11, 11A and 11B, a slightly different pair of lighting systems and diagnostic receptacles is illustrated for a higher wattage (e.g., 2000 watt) lamp example. In the systems of FIG. 11, the lamp schematically illustrated is a "double-ended" commercially available lamp known to those skilled in the art, with wiring at both ends to accommodate an extra capacitor and lamp output from the ballast. In the lower wattage (e.g. 1500 watt) system of FIG. 10, the extra wires from terminals 1 and 7 are simply crimped together to form a closed loop; when the receptacle is used for a 2000 watt lamp, the crimped wires from 1 and 7 can be uncrimped and connected to the extra capacitor and lamp wire ballast terminals as shown in FIG. 11. In the illustrated embodiment, ballasts 210 in FIG. 11 represent commercially available ballasts manufactured by Advance, which come pre-wired with four-wire (FIG. 10) or six-wire (FIG. 11) ballast connections depending on the bulb type and wattage.

The continuity plugs 260 for the 2000 watt array are identical to the continuity plugs 260 used in the 1500 watt lamp array of FIG. 10. Only the wiring of the diagnostic receptacles has been changed, and only with respect to the crimped wires between terminals 1 and 7 in the receptacle. Otherwise, the operation of the diagnostic tester and the method for determining whether any of the components or wiring is faulty is identical to that described with reference to FIGS. 5 and 6 and FIG. 10 above. The only difference is the fact that there is an extra capacitor and lamp wire whose function needs to be checked, and this is achieved by simply uncrimping the wires from diagnostic receptacles 1 and 7 and tapping them into the ballast at the appropriate terminals.

It will also be understood in FIG. 11, that isolation of the common block upon removal of the continuity plugs is identical to the system illustrated in FIG. 10.

Referring now to FIGS. 12–14, an actual dual-system ballast box according to the invention is illustrated generally at 12' and is shown mounted a light pole 13 within ladder height from the ground (e.g., ten feet). FIGS. 12 and 14 also show a modified diagnostic tester 10'. Diagnostic tester 10' is a modified tester 10' similar to the tester in FIG. 1 contained in a convenient carrying case 11, preferably formed from a suitable plastic, with a compartment for cable 18 and a modified diagnostic connector 20'.

In the modified diagnostic tester 10' of FIG. 14, LED indicator lights 24', 26', 28', 29', 30', fuse terminals 81', 83', and push-to-test button 16' generally correspond to like reference numerals in FIG. 1. As in FIG. 1, the test results will cause the same pattern of lighting effects on the face of tester 10', with the exception that the "ballast primary" and "ballast secondary" LED indicator lights 30, 32 in the tester of FIG. 1 have been combined into one LED indicator light 30' in tester 10' of FIG. 14.

Figure 14A:
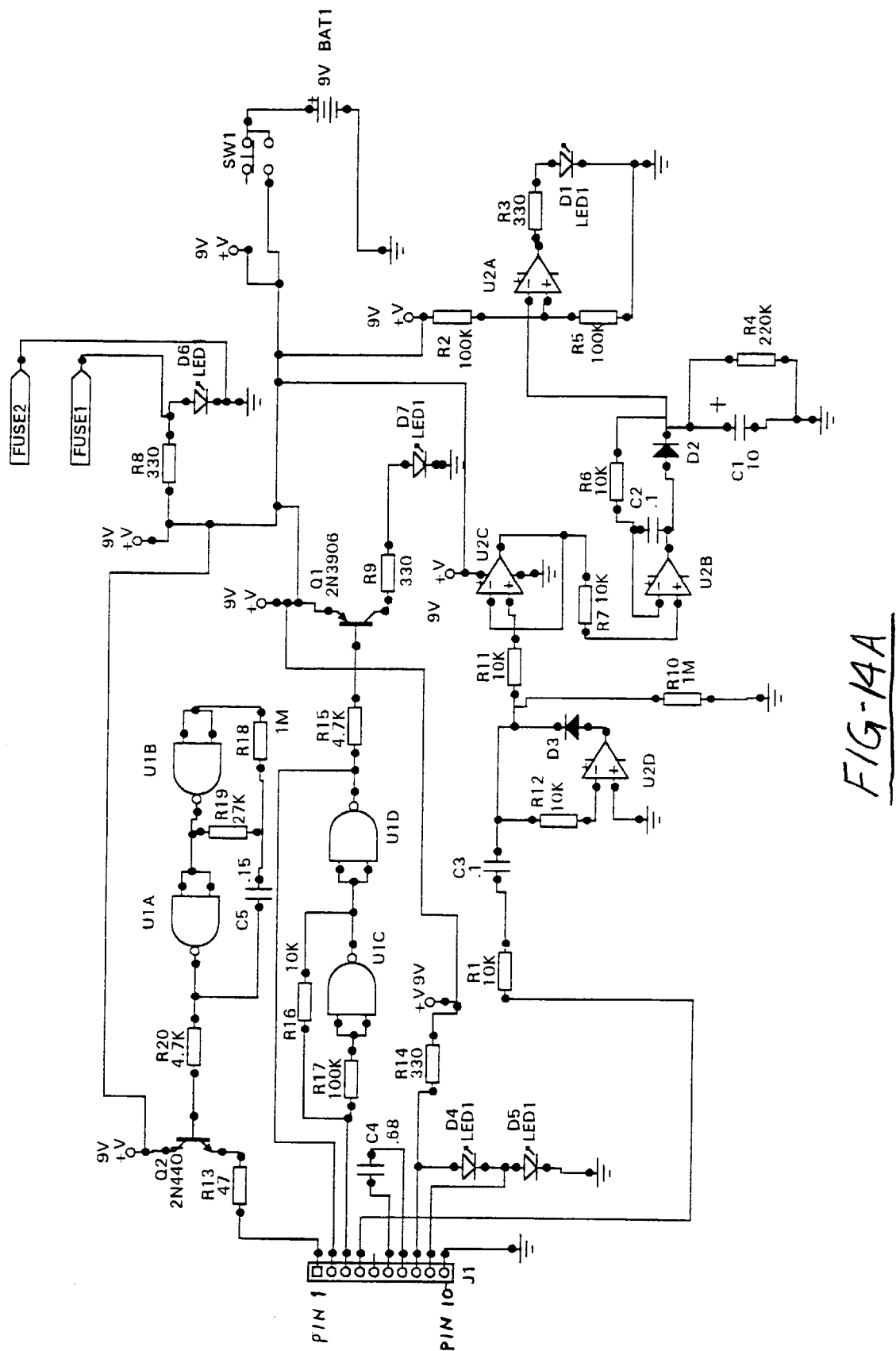
FIG. 14A is a schematic diagram of the diagnostic tester of FIG. 14.

Referring to FIGS. 14A and 14B, the circuitry and pin connections of diagnostic tester 10' and connector 20' are illustrated schematically to show the differences relative to the circuitry and pin connections in diagnostic tester 10 of FIG. 4.

Accordingly, with the invention as shown in FIGS. 10–16, the ballasts and diagnostic receptacles for multiple lighting systems can be combined in a single box, with a common block power and fusing arrangement, and with the main power off can be individually tested with a diagnostic tester such as 10' with assurance that the lighting system being tested is isolated from the common block and any possible backfeed from the other lighting system in that box.

It will be understood by those skilled in the art that while particular receptacle and continuity plug wiring arrangements for particular lighting systems have been illustrated in FIGS. 10 and 11 for purposes of explanation, and a particular diagnostic tester 10' has been illustrated for the particular receptacle and continuity plug arrangements of FIGS. 10 and 11, those skilled in the art will be able to apply the multi-system, single ballast box, multiple diagnostic receptacle, common block isolation invention to different lighting systems with different wiring and components. These and other modifications will be apparent to those skilled'in the art now that we have disclosed the specific embodiments of our invention.

Accordingly, we claim:

1. A diagnostic receptacle system for use with a handheld diagnostic tester and at least two lighting systems sharing a ballast box on a light fixture, each lighting system comprising at least one lamp, a ballast, a capacitor, and a plurality of wires interconnecting the lamp, the ballast, and the capacitor, the diagnostic receptacle system comprising:

a first diagnostic receptacle associated with a first lighting system, and a second diagnostic receptacle associated with a second lighting system, each diagnostic receptacle being electrically connected to each of the lamp, the ballast, and the capacitor in its associated lighting system, each diagnostic receptacle being adapted to receive a connector from a hand held diagnostic tester capable of individually testing operability of the lamp, the ballast, the capacitor, and the plurality of wires interconnecting them, the first and second diagnostic receptacles further being electrically connected to a common block in the ballast box;

first and second continuity plugs mated with the first and second diagnostic receptacles, respectively, each continuity plug comprising a plurality of pins adapted to be inserted in mating terminals in the diagnostic receptacles, the plurality of pins in the continuity plugs being electrically connected in pairs to define continuity paths for the lamp, ballast, capacitor, plurality of wires, and common block when the continuity plug is mated with the diagnostic receptacle; wherein, the first diagnostic receptacle is electrically isolated from the common block when the first continuity plug is removed from the first diagnostic receptacle, and the second diagnostic receptacle is electrically isolated from the common block when the second continuity plug is removed from the second diagnostic receptacle.

2. The diagnostic receptacle system of claim 1, further including a diagnostic tester matable with the first and second diagnostic receptacles in a manner maintaining the electrical isolation of the first and second diagnostic receptacles from the common block during diagnostic testing.

* * * * *